(12) United States Patent
Yang et al.

(10) Patent No.: US 11,445,617 B2
(45) Date of Patent: Sep. 13, 2022

(54) PACKAGE STRUCTURE AND MANUFACTURING METHOD THEREOF

(71) Applicant: Unimicron Technology Corp., Taoyuan (TW)

(72) Inventors: Kai-Ming Yang, Hsinchu County (TW); Chen-Hao Lin, Keelung (TW); Cheng-Ta Ko, Taoyuan (TW); John Hon-Shing Lau, New Territories (HK); Yu-Hua Chen, Hsinchu (TW); Tzyy-Jang Tseng, Taoyuan (TW)

(73) Assignee: Unimicron Technology Corp., Taoyuan (TW)

( * ) Notice: Subject to any disclaimer, the term of this patent is extended or adjusted under 35 U.S.C. 154(b) by 0 days.

(21) Appl. No.: 16/379,816

(22) Filed: Apr. 10, 2019

(65) Prior Publication Data
US 2019/0239362 A1    Aug. 1, 2019

Related U.S. Application Data

(60) Continuation-in-part of application No. 15/701,435, filed on Sep. 11, 2017, now abandoned, which is a
(Continued)

(30) Foreign Application Priority Data

Oct. 31, 2011   (TW) .............................. 100139667
Oct. 20, 2016   (TW) .............................. 105133848
(Continued)

(51) Int. Cl.
*H05K 1/11*    (2006.01)
*H05K 1/18*    (2006.01)
(Continued)

(52) U.S. Cl.
CPC ......... *H05K 3/4038* (2013.01); *H01L 21/486* (2013.01); *H01L 21/4846* (2013.01);
(Continued)

(58) Field of Classification Search
CPC .... H05K 3/4038; H05K 3/4673; H05K 1/142; H05K 1/112; H05K 1/183; H05K 1/11;
(Continued)

(56) References Cited

U.S. PATENT DOCUMENTS 2,263,792 A    11/1941 Wood
3,681,374 A    8/1972 Yano et al.
(Continued)

FOREIGN PATENT DOCUMENTS

CN    102832181 A    12/2012
CN    106206945 A    12/2016
(Continued)

*Primary Examiner* — Ishwarbhai B Patel
(74) *Attorney, Agent, or Firm* — CKC & Partners Co., LLC

(57) ABSTRACT

A package structure is disclosed herein. The package structure includes an insulating composite layer, a sealant disposed on the insulating composite layer, a first chip embedded in the sealant and having a plurality of first conductive pads exposed through the sealant, a circuit layer module having a plurality of circuit layers and a plurality of dielectric layers having a plurality of conductive vias, a second chip embedded in the circuit layer module and has a plurality of second conductive pads electrically connected to the circuit layers through the conductive vias, and a protecting layer having a plurality of openings disposed on the circuit layer module, in which the openings expose a portion of the circuit layer module.

13 Claims, 11 Drawing Sheets

Related U.S. Application Data continuation-in-part of application No. 15/391,861, filed on Dec. 28, 2016, now Pat. No. 11,127,664, which is a continuation-in-part of application No. 14/602,656, filed on Jan. 22, 2015, now Pat. No. 9,781,843, which is a division of application No. 13/604,968, filed on Sep. 6, 2012, now Pat. No. 8,946,564.

(30) Foreign Application Priority Data

| Jul. 14, 2017 | (TW) | .................................. 106123710 |
| Apr. 10, 2018 | (TW) | .................................. 107112303 |

(51) Int. Cl.

| H05K 3/40 | (2006.01) |
|---|---|
| H01L 23/14 | (2006.01) |
| H01L 23/15 | (2006.01) |
| H01L 23/498 | (2006.01) |
| H01L 21/48 | (2006.01) |
| H01L 21/768 | (2006.01) |
| H05K 1/14 | (2006.01) |
| H01L 23/538 | (2006.01) |

(52) U.S. Cl.
CPC .... *H01L 21/4857* (2013.01); *H01L 21/76898* (2013.01); *H01L 23/145* (2013.01); *H01L 23/147* (2013.01); *H01L 23/15* (2013.01); *H01L 23/49822* (2013.01); *H01L 23/49827* (2013.01); *H01L 23/5383* (2013.01); *H01L 23/5384* (2013.01); *H01L 23/5389* (2013.01); *H05K 1/11* (2013.01); *H05K 1/112* (2013.01); *H05K 1/142* (2013.01); *H05K 1/183* (2013.01); *H01L 23/49816* (2013.01); *H01L 2224/131* (2013.01); *H01L 2224/16225* (2013.01); *H01L 2224/16237* (2013.01); *H01L 2224/32225* (2013.01); *H01L 2224/73204* (2013.01); *H01L 2924/00014* (2013.01); *H01L 2924/014* (2013.01); *H01L 2924/15311* (2013.01); *H05K 1/185* (2013.01); *H05K 2201/10674* (2013.01); *Y10T 29/4913* (2015.01); *Y10T 29/49146* (2015.01); *Y10T 29/49165* (2015.01)

(58) Field of Classification Search
CPC .. H05K 1/0271; H05K 3/4682; H05K 3/4694; H05K 2201/10674; H01L 23/49838; H01L 23/49894; H01L 21/4857; H01L 21/486; H01L 23/5389; H01L 21/6835; H01L 23/36; H01L 23/15; H01L 23/49827; H01L 23/147; H01L 21/4846; H01L 21/76898; H01L 23/49822; H01L 23/145; H01L 2924/3511; H01L 2924/15313; H01L 2221/68359; H01L 2221/68345; H01L 2924/15311; H01L 2224/73204; H01L 23/49816; H01L 2924/014; H01L 2224/16225; H01L 2924/00014; H01L 2224/32225; H01L 2224/131; H01L 2224/16237; Y10T 29/49146; Y10T 29/4913; Y10T 29/49165
See application file for complete search history.

(56) References Cited

U.S. PATENT DOCUMENTS

| 5,306,670 | A  | * | 4/1994  | Mowatt    | H01L 23/5383 |
|           |    |   |         |           | 257/E23.172  |
| 6,998,532 | B2 |   | 2/2006  | Kawamoto et al. | |
| 7,507,915 | B2 | * | 3/2009  | Chang     | H01L 23/3121 |
|           |    |   |         |           | 174/260      |
| 8,269,332 | B2 |   | 9/2012  | Sugino et al. | |
| 8,969,140 | B2 |   | 3/2015  | Sankman et al. | |
| 2006/0003495 | A1 | * | 1/2006  | Sunohara | H01L 21/4857 |
|           |    |   |         |           | 438/124      |
| 2006/0110853 | A1 |   | 5/2006  | Chen et al. | |
| 2006/0128069 | A1 |   | 6/2006  | Hsu       | |
| 2007/0035015 | A1 | * | 2/2007  | Hsu       | H01L 23/5389 |
|           |    |   |         |           | 257/723      |
| 2007/0138630 | A1 |   | 6/2007  | Wang et al. | |
| 2007/0206366 | A1 | * | 9/2007  | Tuominen  | H05K 1/0218  |
|           |    |   |         |           | 361/764      |
| 2008/0029870 | A1 | * | 2/2008  | Chen      | H01L 25/0657 |
|           |    |   |         |           | 257/686      |
| 2008/0151518 | A1 | * | 6/2008  | Hsu       | H01L 24/24   |
|           |    |   |         |           | 361/762      |
| 2008/0197469 | A1 | * | 8/2008  | Yang      | H01L 24/19   |
|           |    |   |         |           | 257/686      |
| 2009/0039523 | A1 | * | 2/2009  | Jiang     | H01L 21/82   |
|           |    |   |         |           | 257/777      |
| 2009/0268369 | A1 | * | 10/2009 | Chen      | H01G 4/012   |
|           |    |   |         |           | 361/303      |
| 2011/0111191 | A1 |   | 5/2011  | Lee et al. | |
| 2011/0115071 | A1 |   | 5/2011  | Smeys et al. | |
| 2011/0157775 | A1 | * | 6/2011  | Cheng     | H01G 9/008   |
|           |    |   |         |           | 361/524      |
| 2012/0313243 | A1 | * | 12/2012 | Chang     | H01L 23/3128 |
|           |    |   |         |           | 257/738      |
| 2013/0037950 | A1 | * | 2/2013  | Yu        | H01L 23/49816 |
|           |    |   |         |           | 257/738      |
| 2013/0062045 | A1 |   | 3/2013  | Chu et al. | |
| 2014/0103527 | A1 | * | 4/2014  | Marimuthu | H01L 23/49833 |
|           |    |   |         |           | 257/737      |
| 2014/0233199 | A1 | * | 8/2014  | Munakata  | H05K 3/46    |
|           |    |   |         |           | 361/761      |
| 2015/0243575 | A1 |   | 8/2015  | Strothmann et al. | |
| 2017/0033079 | A1 | * | 2/2017  | Lin       | H01L 25/50   |
| 2017/0110393 | A1 |   | 4/2017  | Tain et al. | |
| 2017/0148755 | A1 |   | 5/2017  | Scanlan et al. | |
| 2017/0263539 | A1 |   | 9/2017  | Gowda et al. | |
| 2017/0373004 | A1 |   | 12/2017 | Yu et al. | |

FOREIGN PATENT DOCUMENTS

| JP | 2015-84394 A | 4/2015 |
| TW | 201719775 A  | 6/2017 |
| TW | 201724460 A  | 7/2017 |

\* cited by examiner

PACKAGE STRUCTURE AND MANUFACTURING METHOD THEREOF

CROSS-REFERENCE TO RELATED APPLICATION

This application is a continuation-in-part of U.S. application Ser. No. 15/701,435, filed Sep. 11, 2017, now pending, which is a continuation-in-part of U.S. application Ser. No. 15/391,861, filed Dec. 28, 2016, now pending, which is a continuation-in-part of U.S. application Ser. No. 14/602,656, filed Jan. 22, 2015, now patented as U.S. Pat. No. 9,781,843, which is a divisional of U.S. application Ser. No. 13/604,968, filed Sep. 6, 2012, now patented as U.S. Pat. No. 8,946,564. The prior U.S. application Ser. No. 15/701,435 claims priority to Taiwan Application serial number 106123710, filed Jul. 14, 2017. The prior U.S. application Ser. No. 15/391,861 claims priority to Taiwan Application serial number 105133848, filed Oct. 20, 2016. The prior U.S. application Ser. No. 13/604,968 claims priority to Taiwan Application serial number 100139667, filed Oct. 31, 2011. This application also claims priority to Taiwan Application Serial Number 107112303, filed Apr. 10, 2018. The entirety of each of the above-mentioned patent applications is hereby incorporated by reference herein and made a part of this specification.

BACKGROUND

Field of Invention

The present disclosure relates to a package structure and a manufacturing method thereof.

Description of Related Art

Along with the advancement in semiconductor packaging technology, there have been various types of packages for semiconductor devices developed besides the conventional wire bonding semiconductor packaging technique. For example, one type of semiconductor devices allows a semiconductor chip having an integrated circuit (IC) to be embedded in and electrically integrated with a package substrate in order to reduce the overall dimension and improve the electrical functions. In order to satisfy the demands of shortening the wire length, reducing the overall thickness, and requirements of high-frequency and miniaturization, a method of processing a chip substrate embedded on a carrier board without a coreless layer has been developed.

However, since the carrier board without a coreless layer lacks a hard core plate for supporting, the carrier board is prone to warpage due to insufficient structural strength. In addition, as the number of chips to be disposed on a planar package substrate (such as a germanium substrate) increases, they can obstruct the downsizing of the package structure and occupy too much area, resulting in a rising manufacturing cost, which is undesired to the application of portable electronic products.

SUMMARY

One purpose of the present disclosure is to provide a package structure and a manufacturing thereof which may address the abovementioned issues.

To achieve the foregoing purpose, one aspect of the present disclosure is to provide a package structure. The package structure includes an insulating composite layer, a sealant, a first chip, a circuit layer module, a second chip and a protecting layer. The sealant is disposed on the insulating composite layer. The first chip is embedded in the sealant. The first chip has a plurality of first conductive pads exposed through the sealant. The circuit layer module is disposed on the sealant and first chip. The circuit layer module includes a plurality of circuit layers and a plurality of dielectric layers. Each dielectric layer has a plurality of conductive vias. Each circuit layer is disposed between the adjacent dielectric layers and in contact with the conductive vias. The bottommost circuit layer is electrically connected to the first conductive pads through the conductive vias. The second chip has a plurality of second conductive pads and is embedded in the circuit layer module. The second conductive pad is electrically connected to the circuit layers through the conductive vias. The protecting layer is disposed on the circuit layer module. The protecting layer has a plurality of openings exposing a portion of the circuit layer module.

According to one embodiment of the present disclosure, the second chip is disposed between the adjacent circuit layers and the dielectric layers, and is located on the circuit layers.

According to one embodiment of the present disclosure, the package structure further includes a third chip embedded in the circuit layer module and located between the adjacent dielectric layers.

According to one embodiment of the present disclosure, the insulating composite layer includes a composite having an inorganic insulating material and an organic material.

According to one embodiment of the present disclosure, the first chip has a first surface and a second surface opposite thereto. The first conductive pads are exposed through the first surface. The sealant covers the second surface.

According to one embodiment of the present disclosure, the package structure further includes a metal layer disposed on the insulating composite layer, which is located between the sealant and the metal layer.

Another aspect of the present disclosure is to provide a method of manufacturing a package structure. The method includes steps of: providing a carrier board comprising a supporting layer, a first release layer, a second release layer and a plurality of metal layer, in which the first release layer and the second release layer is disposed on opposite surfaces of the supporting layer respectively, and the metal layers are disposed on the first release layer and the second release layer; forming an insulating composite layer on the metal layer; disposing a chip packaging module on the insulating composite layer, in which the chip packaging module includes a sealant and a first chip embedded therein, the first chip has a plurality of first conductive pads exposed through the sealant; forming a first circuit layer module on the chip packaging module, in which the first circuit layer module comprises at least one first dielectric layer and at least one first circuit layer, the first dielectric layer has a plurality of first conductive vias, the first circuit layer is located on the first dielectric layer and in contact with the first conductive vias, in which the first circuit layers is electrically connected to the first conductive pads through the first conductive vias; disposing a second chip on the first circuit layer module, the second chip having a plurality of second conductive pads; forming a second circuit layer module on the first circuit layer module and the second chip, in which the second circuit layer module comprises at least one second dielectric layer and at least one second circuit layers, the second dielectric layer has a plurality of second conductive vias, the second circuit layer is located on the second dielectric layer and in contact with the second conductive vias, in which the second circuit layers is electrically connected to the second conductive pads through the second conductive vias; and forming a protecting layer on the second circuit layer module, in which the protecting layer has a plurality of openings exposing a portion of the second circuit layer module.

According to one embodiment of the present disclosure, the at least one first dielectric layer may comprise a plurality of first dielectric layers, while the at least one first circuit layer may comprise a plurality of first circuit layers.

According to one embodiment of the present disclosure, the step of disposing the second chip on the first circuit layer module further includes disposing the second chip on the uppermost first circuit layer of the first circuit layer module.

According to one embodiment of the present disclosure, the step of disposing the second chip on the first circuit layer module comprises disposing an adhesive layer between the uppermost first circuit layer and the second chip.

According to one embodiment of the present disclosure, the method further includes disposing a third chip on the uppermost first dielectric layer of the first circuit layer module.

According to one embodiment of the present disclosure, the first chip has a first surface and a second surface opposite thereto. The first conductive pads are exposed through the first surface, while the second surface is covered by the sealant.

According to one embodiment of the present disclosure, the insulating composite layer comprises a composite having an inorganic insulating material and an organic material.

BRIEF DESCRIPTION OF THE DRAWINGS

The disclosure can be more fully understood by reading the following detailed description of the embodiment, with reference made to the accompanying drawings as follows.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. The examples disclosed below may be combined or substituted with each other in a beneficial situation, and other examples may be added to an example without further description or explanation.

In the following description, specific details are set forth in the description. However, examples of one of the present disclosures may be practiced without such specific details. Furthermore, for simplifying the drawings, some of the conventional structures and elements are shown with schematic illustrations.

Figure 1:
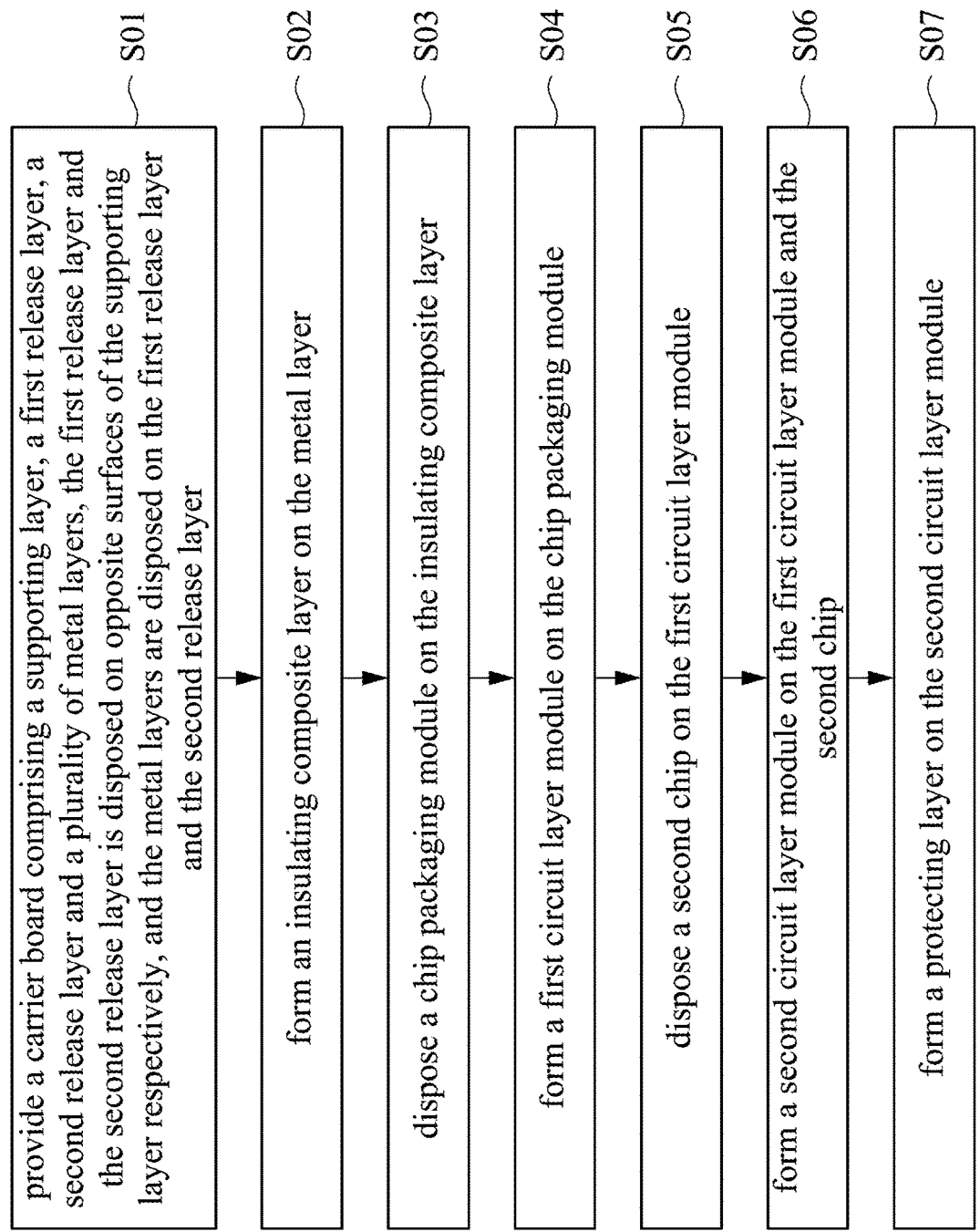
FIG. 1 illustrates a flow chart of a method of manufacturing a package structure according to one embodiment of the present disclosure.

One aspect of the present disclosure is to provide a method of manufacturing a package structure. The package structure formed thereof may have a higher reliability and chip integration density that meets requirements of miniaturization and high processing speed. FIG. 1 illustrates a flow chart of a method 10 of manufacturing a package structure 100 according to one embodiment of the present disclosure. FIG. 2 through FIG. 9 illustrates schematic cross-sectional views of a package structure 100 during various processing stages of a method 10 according to some embodiments of the present disclosure. As shown in FIG. 1, the method 10 includes step S01 to step S07.

Figure 2:
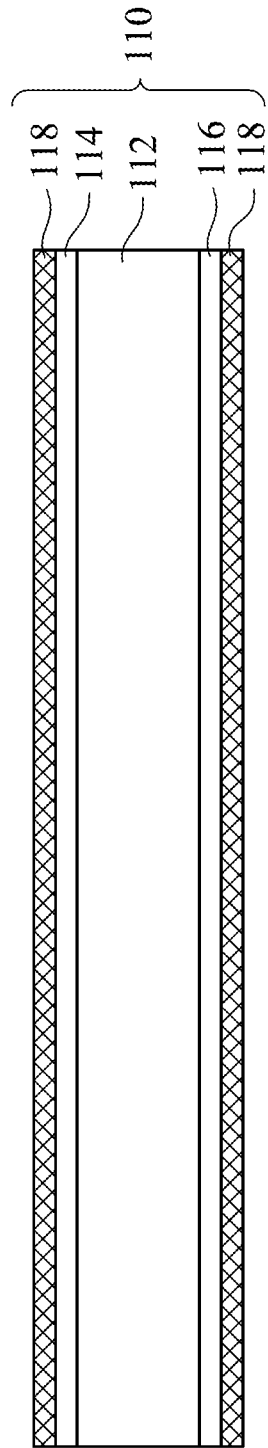
FIG. 2 through FIG. 9 illustrates schematic cross-sectional views of a package structure during various processing stages according to some embodiments of the present disclosure.

At step S01, a carrier board 110 as shown in FIG. 2 is provided. Specifically, the carrier board 110 includes a supporting layer 112, a first release layer 114, a second release layer 116, and a plurality of metal layers 118. The first release layer 114 is disposed on one surface of the supporting layer 112, and the second release layer 116 is disposed on the opposite surface of the supporting layer 112. The metal layers 118 are disposed on each of the first release layer 114 and the second release layer 116. In some embodiments, the supporting layer 112 may be made of a polymeric material such as bismaleimide triazine (BT). In some embodiments, the supporting layer 112 may be a copper clad laminate (CCL) (not shown) with a dielectric material (for example, a prepreg) disposed thereon. In some embodiments, the first release layer 114 or the second release layer 116 may be a release film. In other embodiments, the first release layer 114 or the second release layer 116 may be a copper foil bonded with a release layer available from Mitsui, Nippon-Denk, Furukawa or Olin, for example. In some embodiments, a thickness of the metal layer 118 may range from 1 µm to 10 µm, but is not limited thereto. The metal layers 118 may be made of copper, aluminum, nickel, silver, gold or an alloy thereof, but is not limited thereto. In other embodiments, the metal layers 118 may be a single layer or a stack of a plurality of metal layers 118.

In other embodiments, an additional metal layer (not shown) may exist between the supporting layer 112 and the first release layer 114 and/or between the supporting layer 112 and the second release layer 116. A thickness of the metal layer may range from 5 µm to 40 µm. The additional metal layer and the metal layer 118 may be made of the same material or different material, such as copper, aluminum, nickel, silver, gold, or an alloy thereof, but is not limited thereto.

Figure 3:
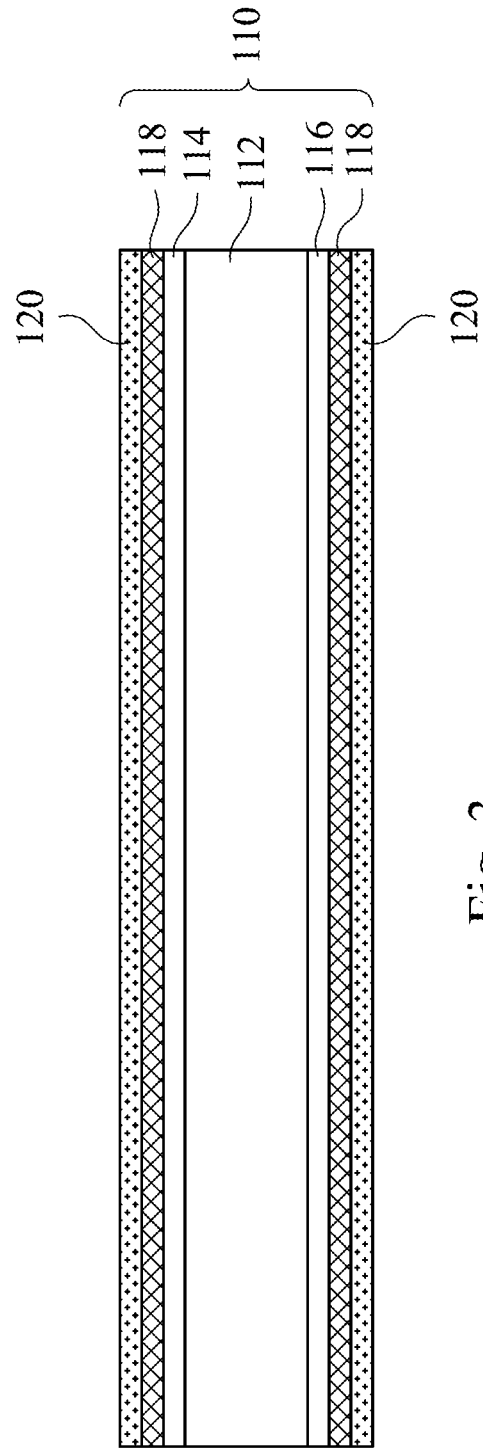

At step S02, an insulating composite layer 120 is formed on each metal layer 118, as shown in FIG. 3. It is understood that the step S02 and following step S03 to step S07 may be performed on a single surface or both opposite surfaces of the carrier board 110. In the present embodiment, a double-sided fabrication of the carrier board 110 is described. In some embodiments, the insulating composite layer 120 comprises a composite having an inorganic insulating material and an organic material. In detail, the inorganic insulating material may include a ceramic material, such as zirconium dioxide, silicon carbide, silicon nitride, aluminum oxide, silicon oxide or a combination thereof, and the organic material may include a polymer, such as epoxy resins, polyimides, liquid crystal polymers, methacrylate resins, polyacrylate resins, allyl resins, vinyl phenyl resins, polysiloxane resins, polyolefin resins, polyurethane resins, polyether resins, or a combination thereof. In one example, the ceramic material may be ceramic flakes, ceramic powder, ceramic microparticles, or ceramic nanoparticles, but is not limited thereto.

In an example where the inorganic insulating material is ceramic powder, the insulating composite layer 120 may be made by impregnating the ceramic powder in a polymer using a vacuum impregnation technique to prepare the insulating composite layer 120, which is a composite consisting of the ceramic powder and polymer. In an example where the polymer is epoxy resins or polyimide resins, the insulating composite layer 120 is disposed on the metal layers 118 by a thermal bonding process, a vacuum impregnation technique with a follow-up UV irradiation and heating process.

In an example where the inorganic insulating material is ceramic flake, the insulating composite layer 120 may be made by impregnating the ceramic flake in a polymer using a vacuum impregnation technique to prepare the insulating composite layer 120, which is a composite consisting of the ceramic flake and polymer. However, the insulating composite layer 120 of the present example can be prepared by other techniques capable of forming the insulating composite layer 120 consisting of a polymer and a ceramic material. In an example where the inorganic insulating material is ceramic flake, the insulating composite layer 120 comprises an organic matter and an inorganic matter (for example, a polymer and ceramic flakes). Due to the adhesion between the organic matter and the inorganic matter, the ceramic flake of the insulating composite layer 120 has a sheet-like or a brick-like (or a combination thereof) laminated microscopic structure, which suppresses the conduction of the lateral breaking force, resulting in significant increase of hardness. Thus, the ceramic flake is relatively hard and has a high elasticity modulus, thereby increasing the strength, brittleness and toughness of the ceramic. In yet another example, the insulating composite layer 120 may be an imitation nacreous layer.

The Young's modulus of the insulating composite layer 120 may range from 20 GPa to 100 GPa. Compared with conventional dielectric layers (with Young's modulus not more than 10 GPa) and conventional packaging material (with Young's modulus not more than 20 GPa), the insulating composite layer 120 of the present example has an excellent hardness which can enhance the structural strength of the package structure.

Figure 4:
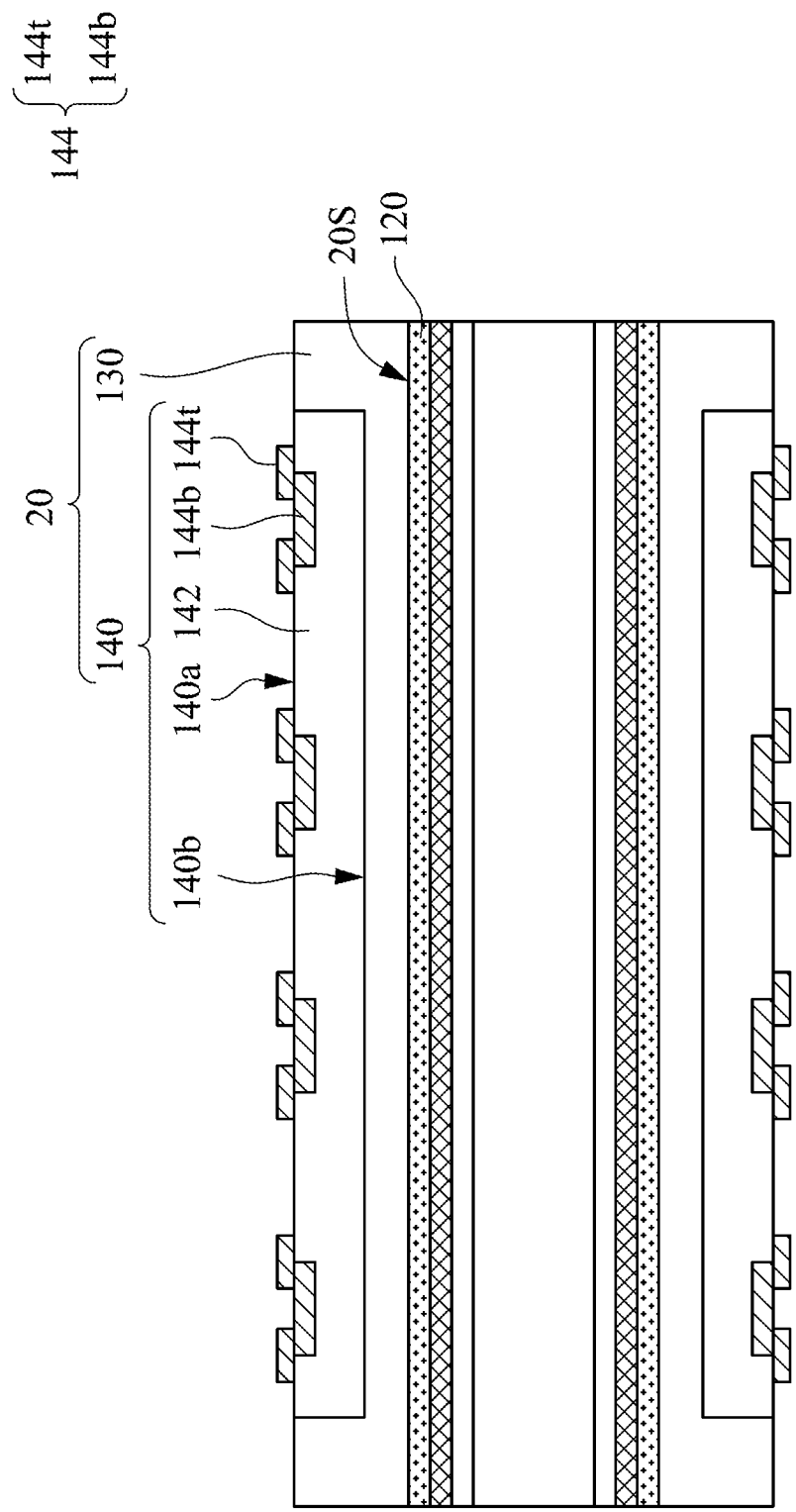

At step S03, a chip packaging module 20 is disposed on the insulating composite layer 120, as shown in FIG. 4. Specifically, the chip packaging module 20 may be disposed on two opposite surfaces of the insulating composite layer 120. The chip packaging module 20 includes a sealant 130 and a first chip 140 embedded therein. The first chip 140 includes a plurality of the first conductive pads 144 and a chip substrate 142. The first conductive pads 144 are exposed through the sealant 130. In some embodiments, the first chip 140 has a first surface 140a and a second surface 140b opposite thereto. The first conductive pads 144 are exposed through the first surface 140a, while the second surface 140b is covered by the sealant 130. The first conductive pad 144 includes a bottom portion 144b below the first surface 140a of the first chip 140 and at least one top portion 144t over the first surface 140a of the first chip 140. The top portion 144t is in contact with the bottom portion 144b. The first chip 140 may be electronic components of various integrated circuits that including discrete components, active or passive elements, digital or analog circuits, ECM, DRAM, SRAM, optoelectronic devices, micro electro mechanical systems (MEMS), microfluidic systems, or physical sensors that measures the variation of some physical quantities such as heat, light, or pressure, RF circuits, accelerators, gyroscopes, micro actuators, surface acoustic component, pressure sensors, or the like, but is not limited thereto. The first chip 140 is shown schematically, the actual length, width, height and dimensions may vary depending on product requirements.

In some embodiments, the chip packaging module 20 is disposed on the insulating composite layer 120 by using an adhesive layer (not shown). Specifically, the adhesive layer may be disposed on a bottom surface 20S of the chip packaging module 20, and the chip packaging module 20 is then disposed on the insulating composite layer 120. In one example, the adhesive layer may include a heat sink with high heat dissipation or high-temperature resistance, but is not limited thereto.

Figure 5:
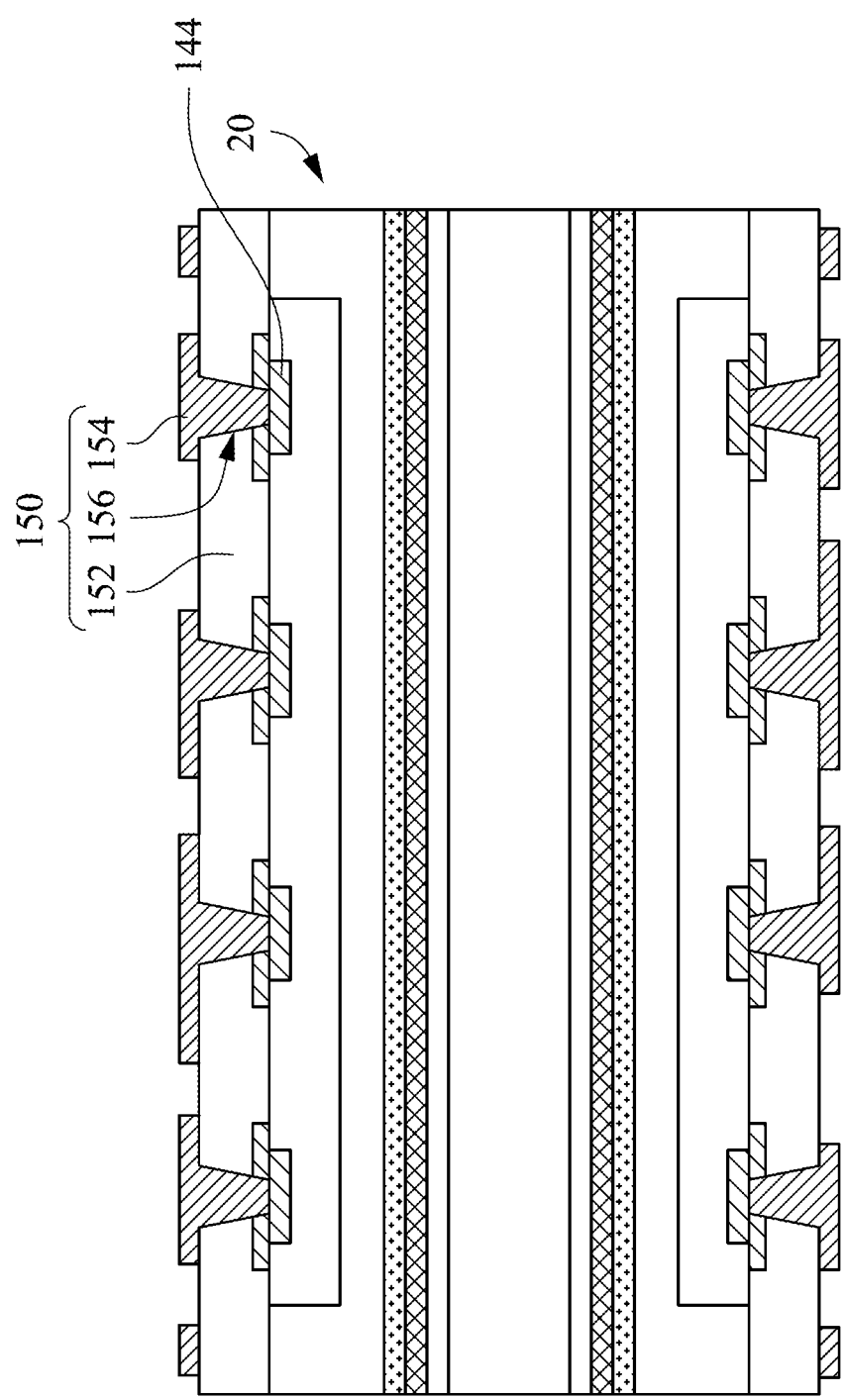

At step S04, a first circuit layer module 150 is formed on the chip packaging module 20, as shown in FIG. 5. Specifically, the first circuit layer module 150 includes at least one the first dielectric layer 152 and at least one the first the circuit layers 154. One skilled in the art can modify the number of the dielectric layers and circuit layers based on actual needs. It is understood that the smallest unit constituting the circuit layer module 150 is one dielectric layer and one circuit layer. The first dielectric layer 152 has a plurality of the first conductive vias 156. The first the circuit layers 154 are disposed on the first dielectric layer 152 and in contact with the first conductive vias 156. The bottommost first circuit layer 154 is electrically connected to the first conductive pads 144 of the first chip 14 through the first conductive vias 156.

In some embodiments, the first dielectric layer 152 may be made of resin and glass fiber. For example, the resin may be phenolic resins, epoxy resins, polyimide resins or a polytetrafluoroethylene. Alternatively, the first dielectric layer 152 may include a photo-imageable dielectric (PID). In some embodiments, the first dielectric layer 152 may be formed by a lamination process, a coating process or other suitable processes. In some embodiments, the blind holes for the formation of the first conductive vias 156 may be formed in the first dielectric layer 152 by using (but not limited to) a laser ablation process, otherwise an exposure and developing process if the first dielectric layer 152 is a photo-imageable dielectric.

The method of forming the first the circuit layers 154 according to a plurality of embodiments is briefly described below. First, a photoresist layer such as a dry film (not shown) is formed on the dielectric layers 152. The photoresist layer is patterned by a lithography process, such that a portion of the dielectric layers 152 is exposed. Next, an electroplating process is performed, followed by removal of the photoresist layer, such that the circuit layers 154 and the first conductive vias 156 are formed. In one example, the circuit layers 154 and the first conductive vias 156 may be made of copper. In other embodiments, before the formation of the circuit layers 154, a seed layer (not shown) may be formed on the dielectric layers 152. The seed layer may be a single-layered structure or a multilayer structure composed of sub-layers of different materials, including a metal layer having a titanium layer and a copper layer thereon, a palladium-plated copper layer, or the like, but is not limited thereto. The seed layer may be formed by a physical process such as sputtering of titanium and copper, or a chemical process such as electroplating of titanium and copper, but is not limited thereto.

Figure 6:
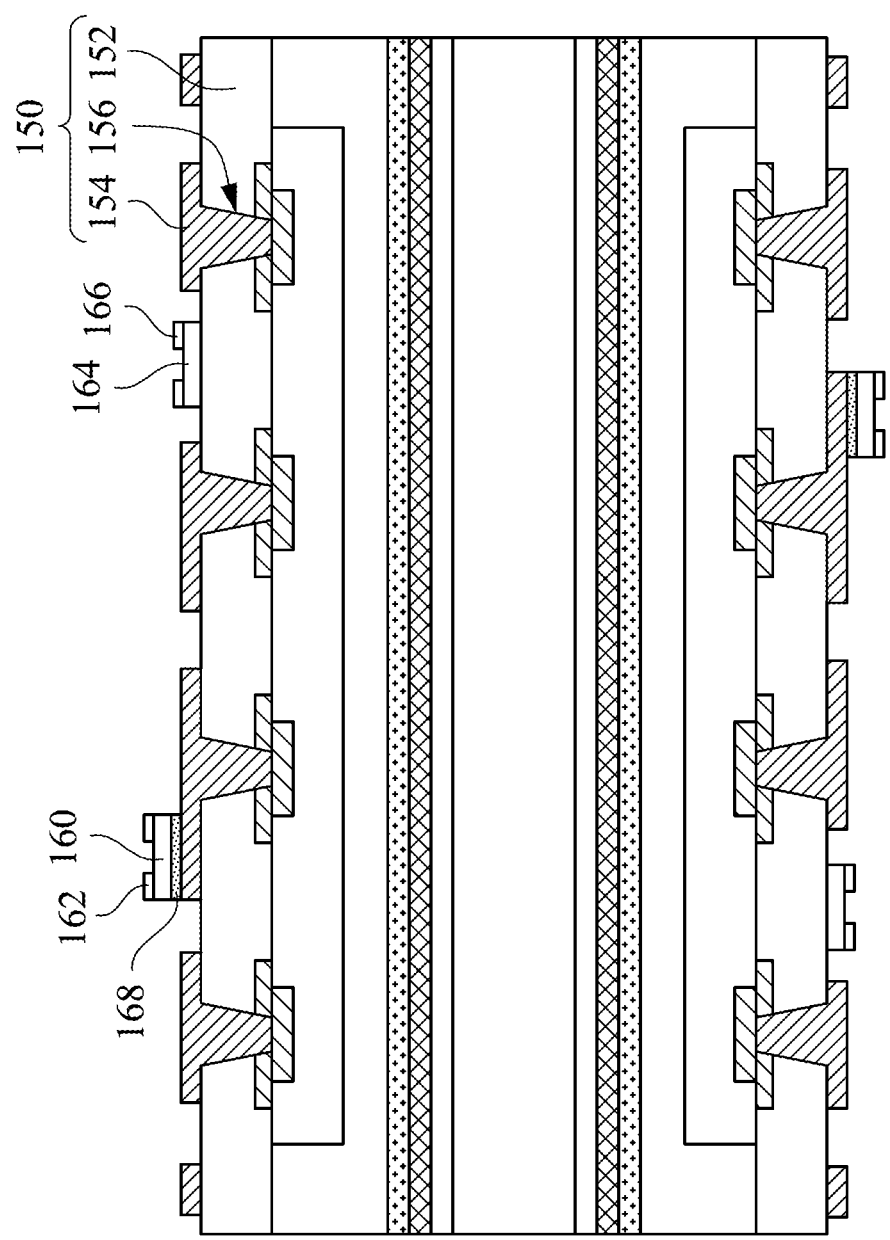

At step S05, a second chip 160 is disposed on the first circuit layer module 150, as shown in FIG. 6. The second chip 160 has a plurality of second conductive pads 162. The second chip 160 may be electronic components of various integrated circuits that including discrete components, active or passive elements, digital or analog circuits, ECM, DRAM, SRAM, optoelectronic devices, micro electro mechanical systems (MEMS), microfluidic systems, or physical sensors that measures the variation of some physical quantities such as heat, light, or pressure, RF circuits, accelerators, gyroscopes, micro actuators, surface acoustic component, pressure sensors, or the like, but is not limited thereto. The second chip 160 is shown schematically, the actual length, width, height and dimensions may vary depending on product requirements.

In one embodiment, the second chip 160 is disposed on the uppermost first the circuit layers 154 of the first circuit layer module 150. In some embodiments, the second chip 160 is disposed on the uppermost first the circuit layers 154 of the first circuit layer module 150 by using an adhesive layer 168. Specifically, the adhesive layer 168 is adhered to the bottom of the second chip 160, followed by bonding the second chip 160 to the first the circuit layers 154. Alternatively, the adhesive layer 168 is adhered to the first the circuit layers 154, followed by bonding the second chip 160 to the adhesive layer 168. In one example, the adhesive layer 168 may include a heat sink with a high heat dissipation or high-temperature resistance, but is not limited thereto. In another embodiment, a third chip 164 may be disposed on the uppermost first dielectric layer 152 of the first circuit layer module 150. In some embodiments, the third chip 164 is disposed on the uppermost first dielectric layer 152 of the first circuit layer module 150 by a thermal bonding process. It is understood that the third chip 164 and the second chip 160 may be the same or different. The third chip 164 is shown schematically, the actual length, width, height and dimensions may vary depending on product requirements.

Figure 7:
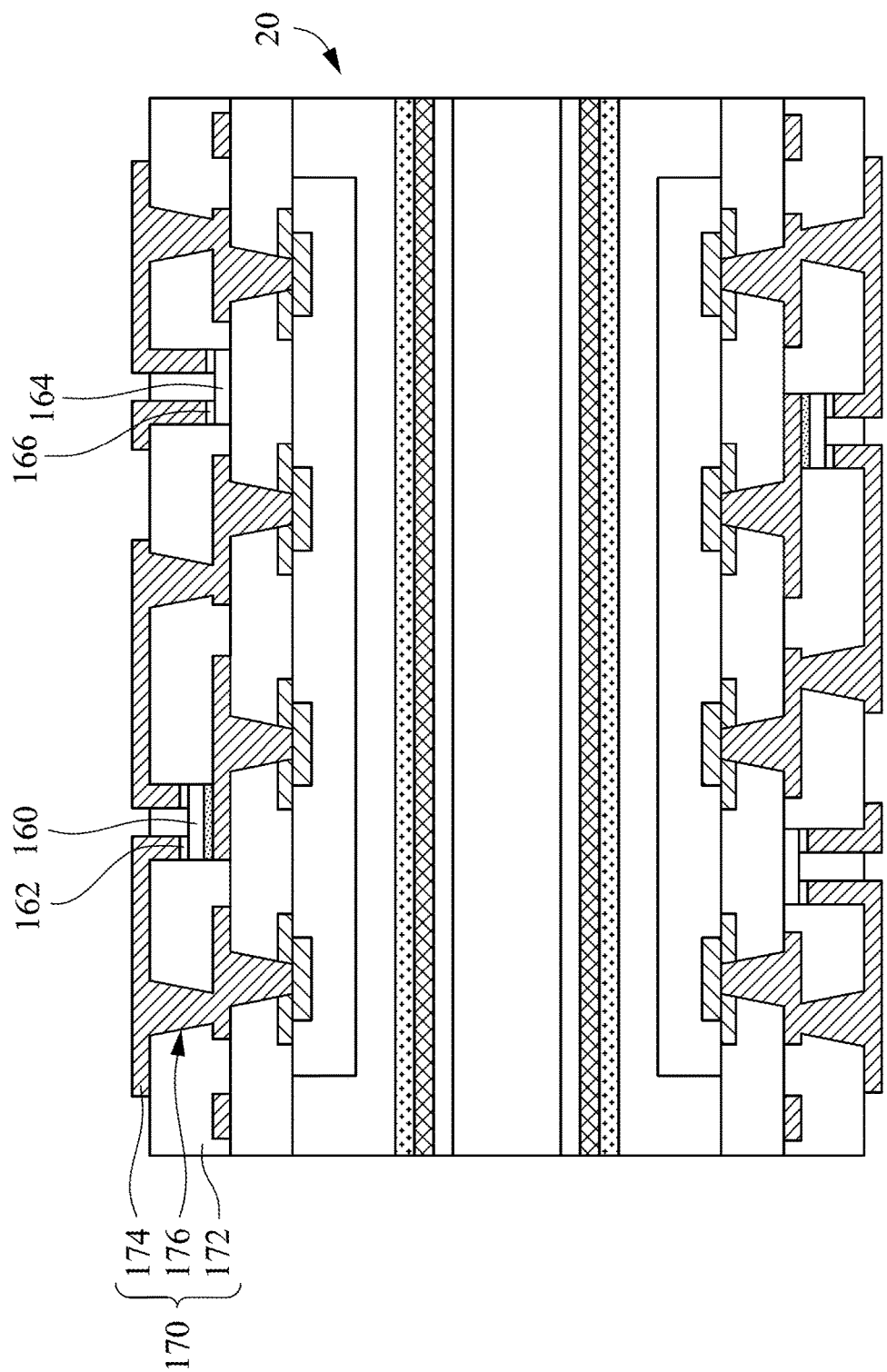

At step S06, a second circuit layer module 170 is formed on the first circuit layer module 150 and the second chip 160, as shown in FIG. 7. Specifically, the second circuit layer module 170 includes at least one the second dielectric layer 172 and at least one the second circuit layer 174. The second dielectric layer 172 has a plurality of the second conductive vias 176. The second circuit layer 174 is disposed on the second dielectric layer 172 and in contact with the second conductive vias 176. The bottommost second circuit layer 174 is electrically connected to the second conductive pads 162 through the second conductive vias 176. It is understood that the smallest layer number constituting the second circuit layer module 170 is one dielectric layer and one circuit layer. One skilled in the art can modify the layer number of the dielectric layer and the circuit layers based on actual needs.

Details including materials and forming method of the second dielectric layer 172, the second circuit layers 174 and the second conductive vias 176 are similar to those of the first dielectric layer 152, the first the circuit layers 154 and the first conductive vias 156 respectively, and therefore are not repeated herein. In addition, before the formation of the second circuit layers 174, the abovementioned seed layer may be formed on the second dielectric layer 172, and the details are not repeated herein.

Figure 8:
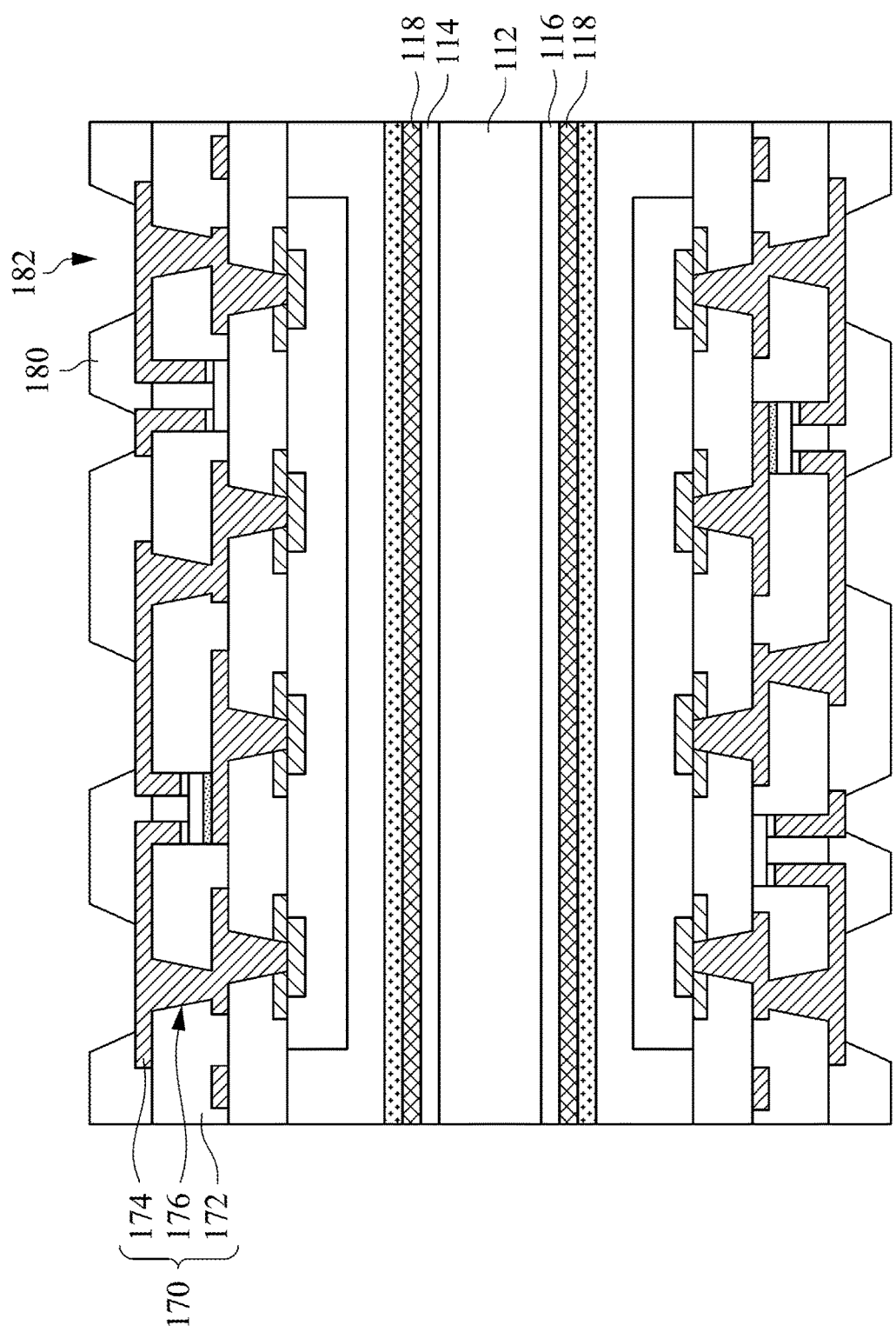

At step S07, a protecting layer 180 is formed on the second circuit layer module 170, as shown in FIG. 8. The protecting layer 180 has a plurality of the openings 182. A portion of the second circuit layer module 170 is exposed through the openings 182. Specifically, as shown in FIG. 8, a portion of the outermost second circuit layers 174 of the second circuit layer module 170 is exposed through the openings 182. In some embodiments, the protecting layer 180 may be made of soldering resist material or resins. Alternatively, the protecting layer 180 may be made of a material similar to that of the first dielectric layer 152 or the second dielectric layer 172. The protecting layer 180 may be formed by a lamination process, a printing process, a coating process, or the like.

Figure 9:
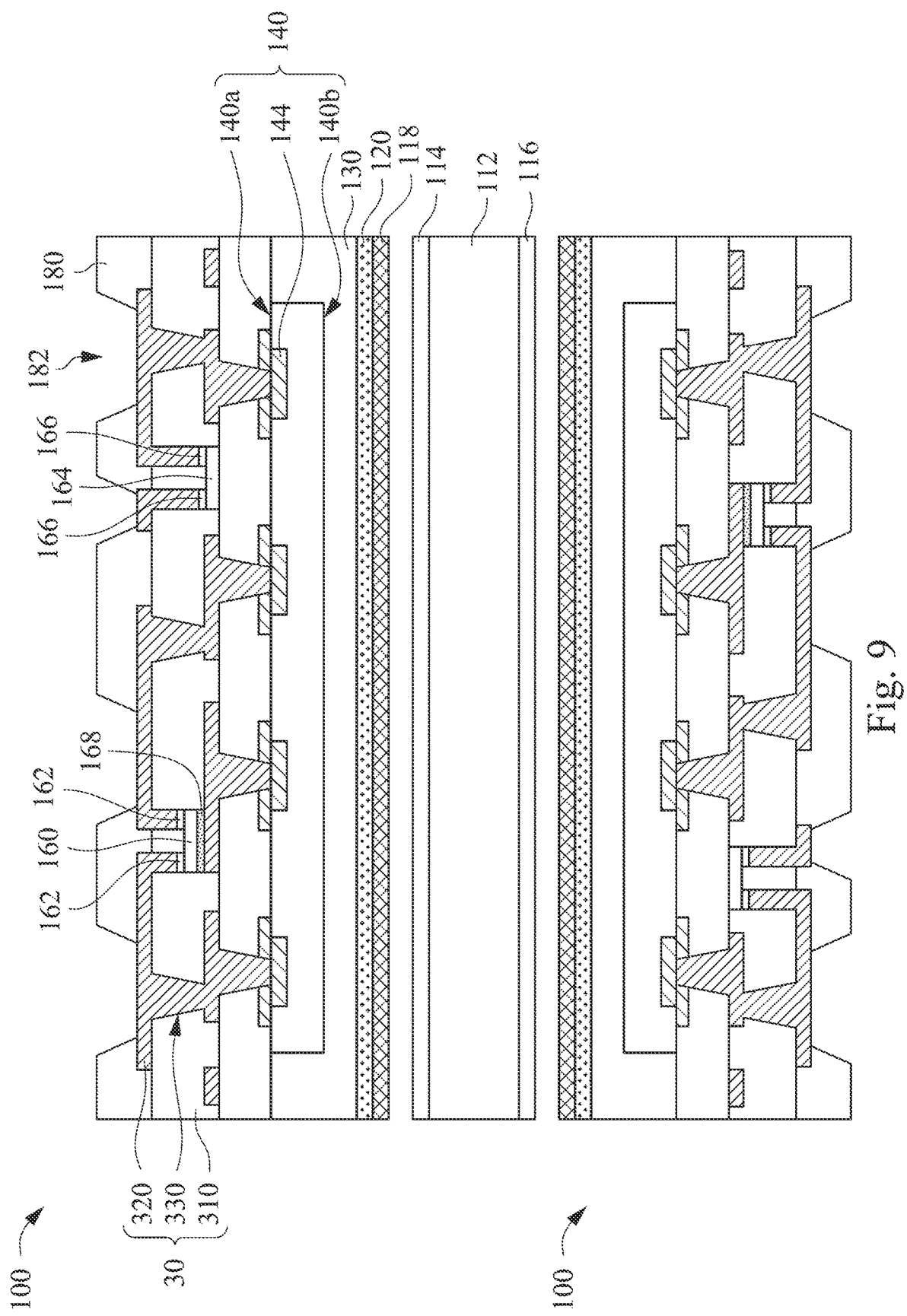

Next, as shown in FIG. 9, the supporting layer 112, the first release layer 114 and the second release layer 116 are removed from the structure shown in FIG. 8 to form two the package structure 100s. In the conventional single-sided manufacturing method, warpage of the supporting layer is often encountered due to its structural asymmetry. However, in the embodiment, by simultaneously performing the same process on opposite surfaces of the supporting layer 112, two symmetry package structures 100 are formed, such that warpage of two ends of the supporting layer 112 can be avoided. In addition, according to embodiments of the present disclosure, the overall reliability of the package structure is increased. The heat generated by the first chip 140 can be dissipated by the heat conduction of the metal layers 118 disposed on the bottom of the package structure 100. In addition, the heat generated by the second chip 160 can be dissipated by the heat conduction of the first the circuit layers 154 disposed on the bottom of the second chip 160, thereby increasing the stability of the second chip 160 when in use.

Another aspect of the present disclosure is to provide a package structure. FIG. 9 illustrates a schematic cross-sectional view of a package structure 100 according to one embodiment of the present disclosure. The package structure 100 includes an insulating composite layer 120, a sealant 130, a first chip 140, a circuit layer module 30, a second chip 160 and a protecting layer 180. In some embodiments, the insulating composite layer 120 includes a composite having an inorganic insulating material and an organic material. Details including material and forming method of the insulating composite layer 120 have been described above, and therefore are not repeated herein. The sealant 130 is located on the insulating composite layer 120. The first chip 140 is embedded in the sealant 130. The first chip 140 has a plurality of the first conductive pads 144 exposed through the sealant 130. In some embodiments, the first chip 140 has a first surface 140a and a second surface 140b opposite thereto. The first conductive pads 144 are exposed through the first surface 140a. The sealant 130 covers the second surface 140b.

The circuit layer module 30 is disposed on the sealant 130 and the first chip 140. The circuit layer module 30 includes a plurality of circuit layers 320 and a plurality of dielectric layers 310. Each dielectric layer has a plurality of conductive vias 330. Each circuit layer 320 is disposed between adjacent dielectric layers 310 and in contact with the conductive vias 330. The bottommost circuit layer 320 is electrically connected to the first conductive pads 144 through the conductive vias 330. The second chip 160 has a plurality of second conductive pads 162 and is embedded in the circuit layer module 30. The second conductive pads 162 are electrically connected to the circuit layers 320 through the conductive vias 330. In one embodiment, the second chip 160 is disposed between the adjacent circuit layers 320 and the dielectric layers 310, and is located on the circuit layers 320. In another embodiment, the second chip 160 is disposed between the adjacent dielectric layers 310. The protecting layer 180 is disposed on the circuit layer module 30. The protecting layer 180 has a plurality of the openings 182 exposing a portion of the circuit layer module 30.

Figure 10:
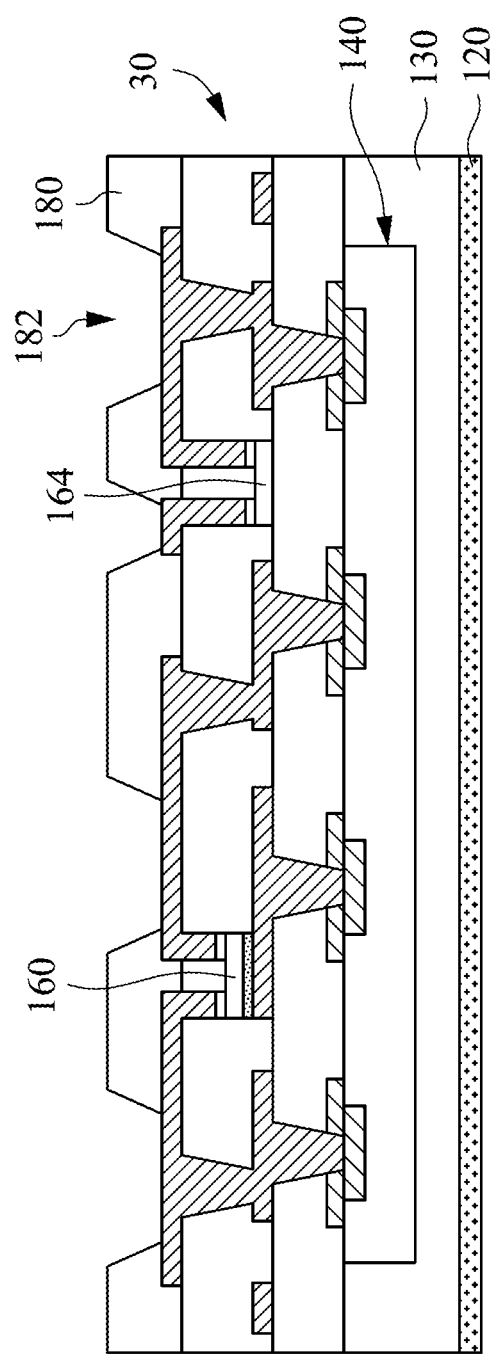
FIG. 10 through FIG. 12 illustrates cross-sectional views of a package structure according to other embodiments of the present disclosure.

FIG. 10 illustrates a cross-sectional view of a package structure 200 according to another embodiment of the present disclosure. The package structure 200 includes an insulating composite layer 120, a sealant 130, a first chip 140, a circuit layer module 30, a second chip 160 and a protecting layer 180. Compared to the package structure 100 shown in FIG. 9, the package structure 200 shown in FIG. 10 does not have any metal layer 118. The manufacturing method of the package structure 200 in the present embodiment is similar to that of the package structure 100, except that in the present example, a metal layer 118 is removed (for example, by an etching process) after the formation of the package structure 100. Consequently, there is no metal layer 118 in the package structure 200 shown in FIG. 10.

Figure 11:
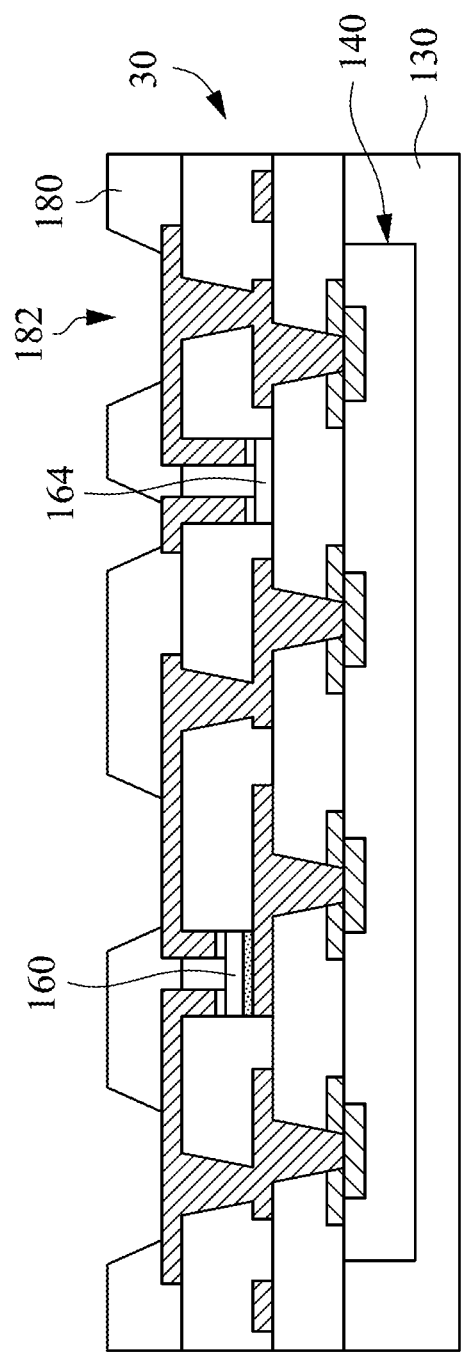

FIG. 11 illustrates a cross-sectional view of a package structure 300 according to another embodiment of the present disclosure. The package structure 300 includes a sealant 130, a first chip 140, a circuit layer module 30, a second chip 160 and a protecting layer 180. Compared to the package structure 200 shown in FIG. 10, the package structure 300 shown in FIG. 11 does not have any insulating composite layer 120. The manufacturing method of the package structure 300 in the present embodiment is similar to that of the package structure 200, except that in the present example, an insulating composite layer 120 is removed (for example, by a polishing process) after the formation of the package structure 200. Consequently, there is no insulating composite layer 120 in the package structure 300 shown in FIG. 11.

Figure 12:
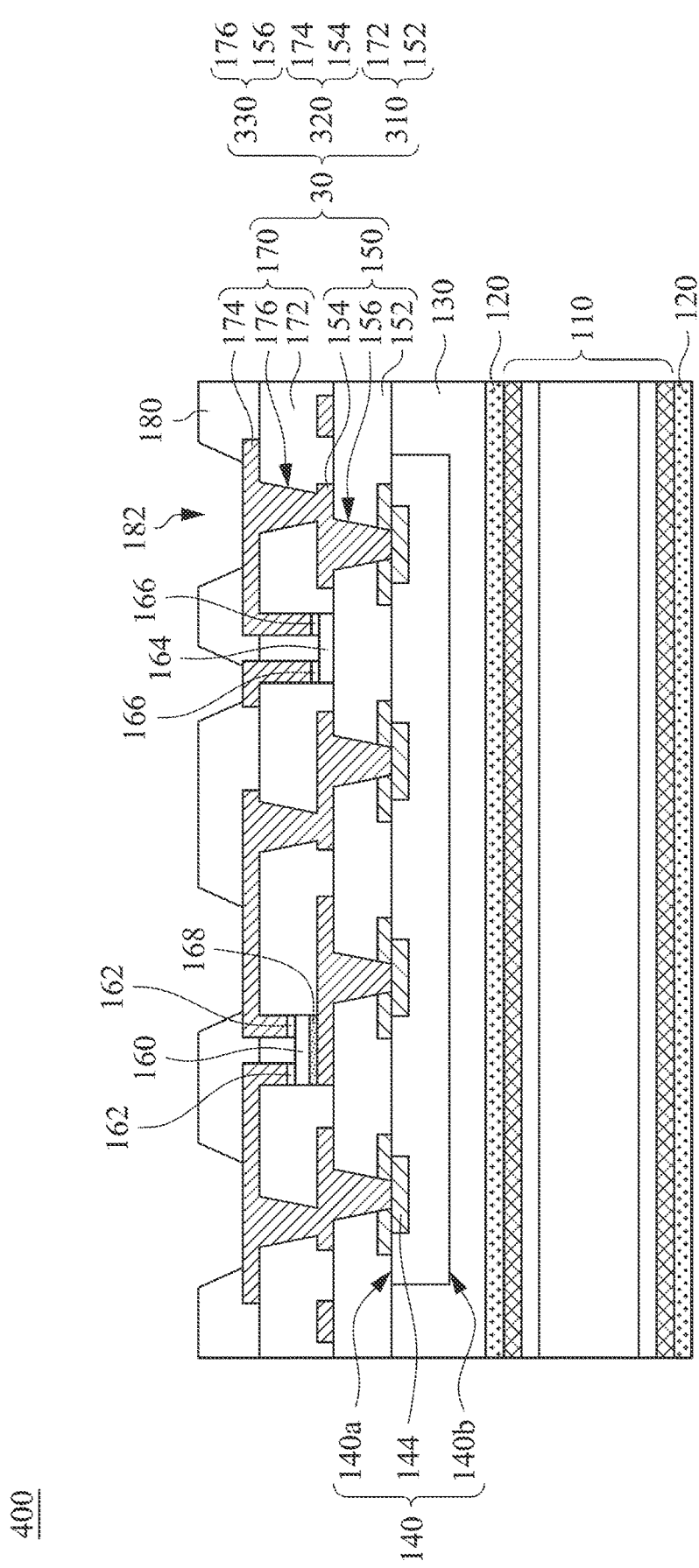

The present disclosure provides a method for manufacturing a package structure. The package structure manufactured by the method may have a higher reliability and integration density and thereby meets requirements of miniaturization and high processing speed. FIG. 12 is a schematic cross-sectional view showing another example of the package structure 400 of the present disclosure. The manufacturing method of the package structure 400 is substantially similar to the manufacturing method of the package structure 100 shown in FIG. 2 through FIG. 9, except that the manufacturing method of the package structure 400 is performed on a single side of the carrier board 110 to form the package structure 400. Specifically, the circuit layer module 30 of the package structure 400 includes the first circuit layer module 150 shown in FIG. 5 and the second circuit layer module 170 shown in FIG. 7. As shown in FIG. 12, the circuit layer module 30 includes a plurality of circuit layers 320 corresponding to the circuit layers 154 and 174 and a plurality of dielectric layers 310 corresponding to the dielectric layers 152 and 172. Each dielectric layer 310 has a plurality of conductive vias 330 corresponding to the conductive vias 156 and 176. The layer number, components, and materials of each layer and component in the single-sided fabrication have been described above, and therefore are not repeated herein.

The insulating composite layer used in the package structure of the present disclosure can be regarded as a strengthening layer. The insulating composite layer has a higher elasticity modulus than that of a general dielectric layer or a packaging material. Therefore, the insulating composite layer can be used to increase the structural strength of the package structure of the present disclosure to prevent the carrier board from warpage, resulting in higher process yield and reliability of the package structure. The package structure also includes a second chip embedded in the circuit layer module, such that the integration density is increased and thereby meeting requirements of miniaturization and high processing speed.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:
1. A package structure, comprising:
an insulating composite layer having an upper surface;
a sealant disposed on the insulating composite layer and covering an entirety of the upper surface of the insulating composite layer;
a first chip embedded in the sealant, wherein the first chip has a plurality of first conductive pads disposed on an upper surface of the first chip and exposed through the sealant, a sidewall and a bottom surface of the first chip are covered by the sealant, and each of the first conductive pads has a bottom portion below the upper surface of the first chip and at least one top portion over the upper surface of the first chip, and the top portion is in contact with the bottom portion;
a circuit layer module disposed on the sealant and the first chip, wherein the circuit layer module comprises a plurality of circuit layers and a plurality of dielectric layers, each of the dielectric layers has a plurality of conductive vias, each of the circuit layers is disposed between the adjacent dielectric layers and in contact with the conductive vias, the bottommost circuit layer is electrically connected to the first conductive pads through the conductive vias, and the conductive vias are in contact with the top portions and the bottom portions of the first conductive pads;
a second chip embedded in the circuit layer module, the second chip having a plurality of second conductive pads, the second conductive pads electrically connected to the circuit layers through the conductive vias; and
a protecting layer disposed on the circuit layer module, wherein the protecting layer has a plurality of openings exposing a portion of the circuit layer module.

2. The package structure of claim 1, wherein the second chip is disposed between the adjacent circuit layers and the dielectric layer, and is located on the circuit layers.

3. The package structure of claim 1, further comprising a third chip embedded in the circuit layer module and located between the adjacent dielectric layers.

4. The package structure of claim 1, wherein the insulating composite layer comprises a composite having an inorganic insulating material and an organic material.

5. The package structure of claim 1, further comprising a metal layer disposed on the insulating composite layer, the insulating composite layer is between the sealant and the metal layer.

6. The package structure of claim 1, wherein the second chip has a bottom surface that is free of the second conductive pads and faces the upper surface of the first chip.

7. The package structure of claim 1, wherein the second chip has a bottom surface entirely disposed on one of the circuit layers of the circuit layer module.

8. The package structure of claim 1, wherein the second chip has a bottom surface that is free of the second conductive pads and faces the upper surface of the first chip, wherein the bottom surface of the second chip is entirely disposed on one of the circuit layers of the circuit layer module.

9. The package structure of claim 1, further comprising a third chip embedded in the circuit layer module, wherein the third chip has a bottom surface entirely disposed on one of the dielectric layers of the circuit layer module.

10. The package structure of claim 9, wherein the second chip has a bottom surface entirely disposed on one of the circuit layers of the circuit layer module.

11. A package structure, comprising:
- a sealant;
- a first chip embedded in the sealant, wherein the first chip has a plurality of first conductive pads exposed through the sealant, and a sidewall and a bottom surface of the first chip are covered by the sealant;
- a first circuit layer module disposed on the sealant and the first chip, wherein the first circuit layer module comprises a first circuit layer and a first dielectric layer, the first dielectric layer has a at least one first conductive via, the first circuit layer is disposed on the first dielectric layer and in contact with the first conductive via, the first circuit layer is electrically connected to the first conductive pads through the first conductive via;
- a second circuit layer module disposed on the first circuit layer module, wherein the second circuit layer module comprises a second circuit layer and a second dielectric layer, the second dielectric layer has at least one second conductive via, the second circuit layer is disposed on the second dielectric layer and in contact with the second conductive via;
- a second chip embedded in the second circuit layer module, the second chip having a plurality of second conductive pads on an upper surface of the second chip, the second chip having a bottom surface facing the first chip and being free from the second conductive pads, the second conductive pads electrically connected to the first circuit layer through the second conductive via on the first circuit layer;
- an adhesive layer directly disposed between the entire bottom surface of the second chip and the first circuit layer of the first circuit layer module, the adhesive layer directly contacting the entire bottom surface of the second chip and the first circuit layer, wherein the adhesive layer and the second chip are disposed between the second dielectric layer and the first circuit layer; and
- a protecting layer disposed on the second circuit layer module, wherein the protecting layer has a plurality of openings exposing a portion of the second circuit layer module.

12. A package structure, comprising:
- a sealant;
- a first chip embedded in the sealant, wherein the first chip has a plurality of first conductive pads exposed through the sealant, and a sidewall and a bottom surface of the first chip are covered by the sealant;
- a circuit layer module disposed on the sealant and the first chip, wherein the circuit layer module comprises a plurality of circuit layers and a plurality of dielectric layers, each of the dielectric layers has a plurality of conductive vias, portions of the two adjacent dielectric layers are in direct contact with each other, each of the circuit layers is disposed between the two adjacent dielectric layers and in contact with the conductive vias, the bottommost circuit layer is electrically connected to the first conductive pads through the conductive vias;
- a second chip embedded in the circuit layer module, the second chip having a plurality of second conductive pads on an upper surface of the second chip, the second chip having a bottom surface facing the first chip and being free from the second conductive pads, the second conductive pads electrically connected to the bottommost circuit layer through the conductive via on the bottommost circuit layer;
- an adhesive layer disposed between the entire bottom surface of the second chip and the circuit layer of the circuit layer module, wherein the adhesive layer directly contacts the entire bottom surface of the second chip and the circuit layer; and
- a protecting layer disposed on the circuit layer module, wherein the protecting layer has a plurality of openings exposing a portion of the circuit layer module.

13. The package structure of claim 12, wherein each of the circuit layers disposed between the two adjacent dielectric layers is in direct contact with the two adjacent dielectric layers.

* * * * *